United States Patent [19]

Kappeler

[11] Patent Number: 4,683,444
[45] Date of Patent: Jul. 28, 1987

[54] GENERATOR CIRCUIT FOR GENERATING TWO SINUSOIDAL SIGNALS WITH A PHASE DIFFERENCE OF 90 DEGREES

[75] Inventor: Otmar Kappeler, Neuenburg, Fed. Rep. of Germany

[73] Assignee: Deutsche ITT Industries GmbH, Freiburg, Fed. Rep. of Germany

[21] Appl. No.: 810,610

[22] Filed: Dec. 13, 1985

[30] Foreign Application Priority Data

Dec. 14, 1984 [EP] European Pat. Off. ...... 84 11 5450.3

[51] Int. Cl.$^4$ .................... H03B 21/02; H03L 7/18
[52] U.S. Cl. .................................. 331/25; 331/38; 331/40; 331/41; 331/45
[58] Field of Search .............. 331/25, 37, 38, 40, 331/41, 42, 43, 45; 329/50, 122, 124; 328/14, 15

[56] References Cited

U.S. PATENT DOCUMENTS

| | | | |
|---|---|---|---|
| 2,920,284 | 1/1960 | Beagles et al. | 331/38 |
| 3,961,262 | 6/1976 | Gassmann | 455/207 |
| 3,999,130 | 12/1976 | Whisler | 375/16 |
| 4,193,035 | 3/1980 | Berger | 455/203 |

FOREIGN PATENT DOCUMENTS

| | | |
|---|---|---|
| 0122657 | 10/1984 | European Pat. Off. . |
| 0124949 | 11/1984 | European Pat. Off. . |
| 2828224 | 1/1980 | Fed. Rep. of Germany ........ 331/38 |

Primary Examiner—Siegfried H. Grimm
Attorney, Agent, or Firm—Thomas L. Peterson

[57] ABSTRACT

A generator circuit according to the invention generates two 90° phase-shifted frequency-variable sinusoidal signals by mixing the output signal of a fixed-frequency oscillator and of a continuously variable oscillator with the aid of two multipliers operating as mixers. The fixed-frequency signal is applied to the second multiplier via a 90° phase shifter. The output signal of the multipliers which contains the sum and the difference frequency of its input signals, is respectively fed to a low-pass filter or to a band-pass filter, which suppresses the sum frequency or the difference frequency respectively. By the 90° phase shifter, the sinusoidal signal is phase-shifted with respect to the sinusoidal signal by exactly 90°. During the continuous variation process, the signal as applied to the 90° phase shifter remains stable in its frequency, whereas the output signal of the continuously variable oscillator as fed directly to the two multipliers, is changed in its frequency.

5 Claims, 3 Drawing Figures

GENERATOR CIRCUIT FOR GENERATING TWO SINUSOIDAL SIGNALS WITH A PHASE DIFFERENCE OF 90 DEGREES

BACKGROUND OF THE INVENTION

The invention pertains to a signal generator circuit.

More specifically, the invention relates to a generator circuit for generating two jointly frequency-variable sinusoidal signals which are phase shifted with respect to one another by exactly 90°. The generator circuit includes a fixed frequency oscillator whose output is connected to the input of a 90° phase shifter and to the first input of an analog multiplier, and further includes a second analog multiplier whose first input is connected to the output of the 90° phase shifter.

One such generator circuit is disclosed in the European patent specification No. B1-0 003 867. In this circuit a phase-locked loop which is locked to a stereo sound-modulated carrier signal, represents a fixed frequency oscillator which is connected to the first input of a first analog multiplier and via a 90° phase shifter to the first input of a second analog multiplier. To the respective second input of the multipliers there is applied the stereo sound-modulated carrier signal. The two output signals of the multipliers represent two components of the stero signal differing from one another and are applied to parts of the circuit, which are of no particular interest in this case, for finally generating both the right-hand and the left-hand sound channel signal.

The invention is useful in the field of analog quadrature mixture which requires two sinusoidal signals which are phase shifted with respect to one another by 90°. Very particular requirements are placed on such quadrature mixing circuits in the case of the direct demodulation of amplitude- or frequency-modulated carrier signals according to the "third method", also referred to as the weafer deep-IF or zero-IF method. Requirements are placed on the circuits with respect to the accuracy of the 90° phase shift in the case of an additional frequency variability, because conversion to an intermediate frequency is omitted and the conversion is carried out directly from the carrier frequency range into the LF range, cf. Meinke/Gundlach, Taschenbuch der Hochfrequenztechnik, 2nd edition, 1962, pp. 1311 to 1313 and 1499. A 1% phase error which is likely to result from the frequency dependence of the 90° phase shifter reduces e.g., according to the German published Patent Application No. DE-A-23 58 288, the signal-to-noise ratio 40 dB in the case of amplitude-modulated carriers. This has a disturbing effect in audio applications.

SUMMARY OF THE INVENTION

In accordance with the invention an improved generator circuit is provided for generating two frequency variable sinusoidal signals which are phase shifted by exactly 90°. The 90° phase shifter is not supplied with the variable oscillator signal, but with a fixed frequency signal. The desired variable sinusoidal signals which are phase shifted by 90° are generated by a mixing down from the phase-shifted and the non-phase-shifted fixed frequency signal as well as the variable oscillator signal with the aid of two mixers. Filtering is provided by low-pass filters connected to the outputs.

One advantage obtainable by the invention is that input frequency variation has no influence on the frequency dependence of the 90° phase shifter. A further advantage is that balancing of the necessary capacitors or of the corresponding resistors for a monolithic integrated generator circuit can be carried out on the semiconductor crystal without any corresponding external components, or that balancing can be carried out electronically with the aid of a corresponding reactance circuit. Integration of the circuit improves the RF single-beam resistance of the circuit, because the structures are small, closely neighboured and, from an RF point of view, have no single-beam sensitive outer terminals. By mixing and filtering-away of the harmonics there results the added advantage that either the fixed frequency signal supplying both the first multiplier and the 90° phase shifter, or the variable oscillator signal jointly supplying the two multipliers may also have harmonic contents such as a rectangular signal with a pulse/no pulse ratio of 1:1, e.g., the output signal of a frequency divider. The respective other supply signal must not contain any harmonics, i.e., it must be a sinusoidal signal.

Generator circuits according to the invention are also monolithically integrable for the processing of low-frequency carrier frequencies (long and medium wave broadcasting), because the actual 90° phase shift is effected at a high frequency prior to being mixed down, e.g., above 10 MHz. At this frequency, RC circuits of high quality consisting of sheet-resistors and metal-insulating-layer (MIS) capacitors or reactance circuits are easily integrable as far as the size is concerned; the same also applies to the realization of the low-pass filters.

One particularly advantageous further embodiment of the generator circuit according to the invention, apart from the processing or handling of the low-frequency carrier frequencies, also permits the processing or handling of high-frequency carrier frequencies.

BRIEF DESCRIPTION OF THE DRAWING

The invention will be better understood from a reading of the following detailed description in conjunction with the drawing in which.

DETAILED DESCRIPTION

Figure 1:
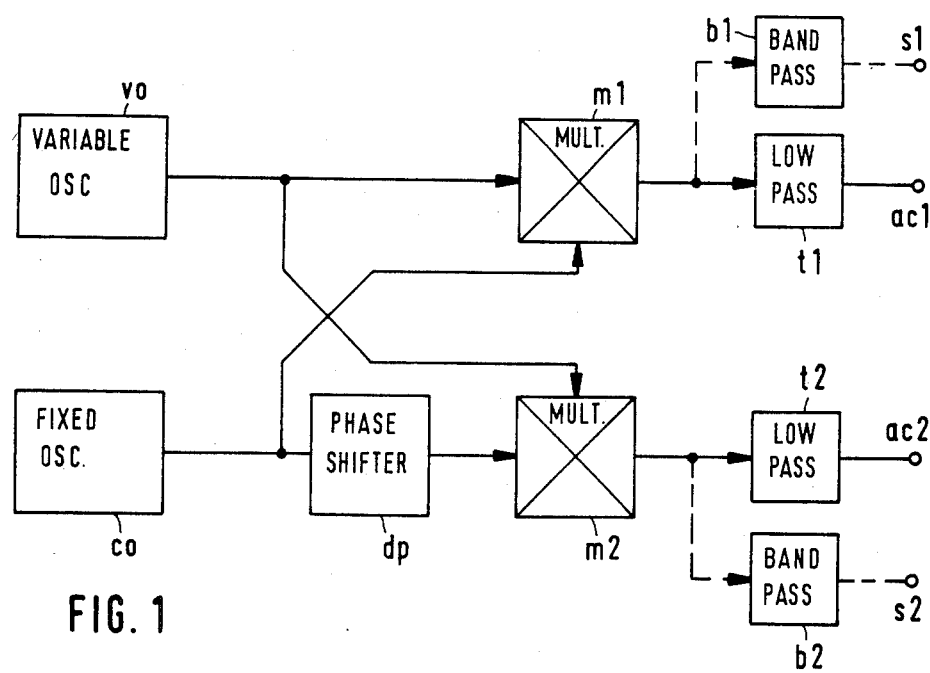
FIG. 1 is a block diagram of a generator circuit in accordance with the invention.

In the generator circuit of FIG. 1 a fixed frequency oscillator co has its output connected to a 90° phase shifter dp and to the first input of a first multiplier m1. The second input thereof is connected to variable oscillator vo. The output of the 90° phase shifter dp is connected to the first input of a second multiplier m2 whose second input is connected to the output of the oscillator vo, and whose output is connected to the input of a second low-pass filter t2. The output of the first multiplier m1 is connected to the input of first low-pass filter t1, at the output terminal of which the one sinusoidal signal ac1 is available. The other sinusoidal signal ac2 is available at the output terminal of the second low-pass filter t2.

In the aforementioned further embodiment of the invention, the output of the first multipler m1 is connected to a first band-pass filter b1, at the output terminal of which the first sinusoidal sum frequency signal s1 can be taken off. The output of the second multiplier m2 is connected to a second band-pass filter b2, from the output terminal of which the second sinusoidal sum frequency signal s2 is provided. The connection between the two band-pass filters b1, b2 and the multipliers m1, m2 is indicated by dashed lines in FIG. 1.

When the fixed frequency oscillator co operates at a frequency of e.g., 30 MHz and the variable oscillator vo operates at a frequency of e.g., 31 MHz, frequency mixtures of both the sum and the difference frequency of the oscillators co, vo will occur at the output of the two multipliers m1, m2. In the given example, the sum frequency amounts to 61 MHz and the difference frequency amounts to 1 MHz. Due to the 90° phase shifter dp, the output voltage (signal) of the second multipleir m2 is shifted in phase by exactly 90° with respect to the output voltage (signal) of the first multiplier m1 in its sum frequency as well as also in its difference frequency. Since the upper limit or cutoff frequency of the two low-pass filters t1, t2 lies between the sum frequency and the difference frequency, the sum frequencies are suppressed by the low-pass filters t1, t2. Therefore only the difference frequencies appear as the sinusoidal signal ac1 and ac2 at the respective output terminals, with the mutual phase shift amounting to exactly 90°.

In an example in which the two band-pass filters b1, b2 are connected, the fixed frequency oscillator co oscillates at a frequency of 44.4 MHz. When the variable oscillator vo sweeps over a frequency range extending from 44.5 to 44.7 MHz, the difference frequency lies within the longwave broad-casting range between 100 and 300 kHz. When the variable oscillator vo sweeps over a frequency range extending from 44.9 to 45.9 MHz, then the difference frequency lies within the medium-wave broadcasting range between 500 and 1500 kHz. When the variable oscillator vo sweeps over a frequency range extending from 44.6 to 65.6 MHz, the sum frequency lies within the FM broadcasting range extending from 89 to 110 MHz. In this particular example, the pass range of the band-pass filters b1, b2 must be at least as large as the FM broadcast FM range, but the band-pass filters shall always suppress the difference frequency as well as the mixed frequencies which are higher than the sum frequencies.

Figure 2:
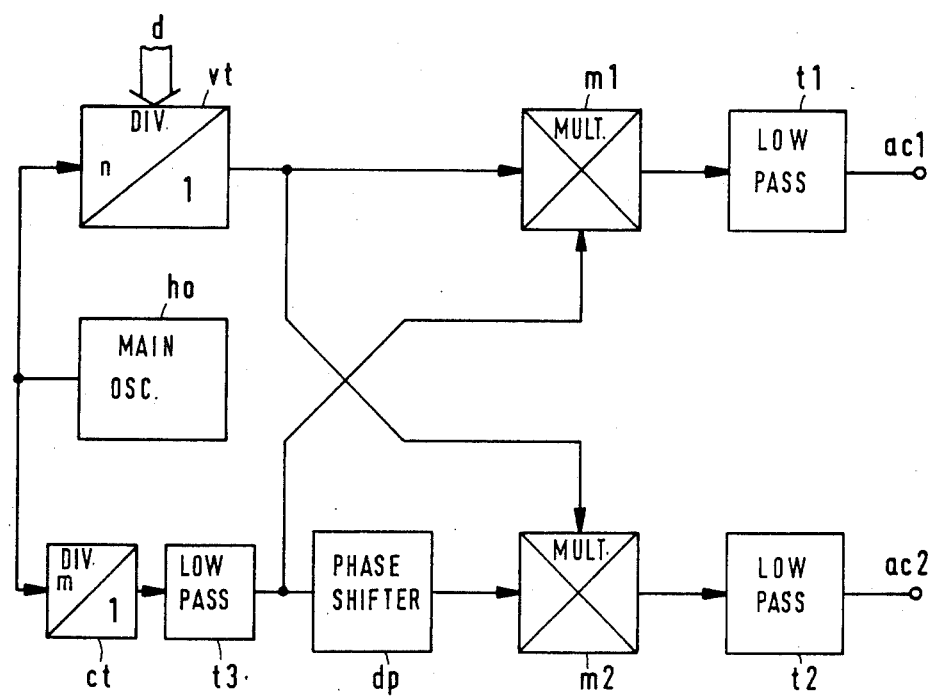
FIG. 2 is a block diagram of a further embodiment comprising a main oscillator and frequency dividers.

FIG. 2 shows another embodiment of the invention. Compared to FIG. 1, the fixed frequency oscillator co and the variable oscillator vo are replaced by a main oscillator ho which is connected to a fixed frequency divider ct which is followed by a third low-pass filter t3, and to a variable frequency divider vt. The output signal of the third low-pass filter t3 corresponds to the output signal of the fixed frequency oscillator co and is applied to the input of the 90° phase shifter dp and to the first input of the first multiplier m1. The output signal of the variable frequency divider vt whose integral or non-integral number divisory is set by the data d, corresponds to the output signal of the variable oscillator vo and is connected to the respective second input of multipliers m1, m2.

As a numerical example, let it be assuemd that the main oscillator ho oscillates at 75 MHz. At the output of the fixed frequency divider ct, if the divisor is 2.5, this results in an output frequency of 30 MHz. Via the data d, the variable frequency divider vt is set to a number of divisions of 2.4193. Accordingly, its output frequency almost amounts to 31 MHz. In this way, the frequency of two sinusoidal signals ac1, ac2, as in the first example, amounts to 1 MHz at a phase shift of exactly 90°.

Figure 3:
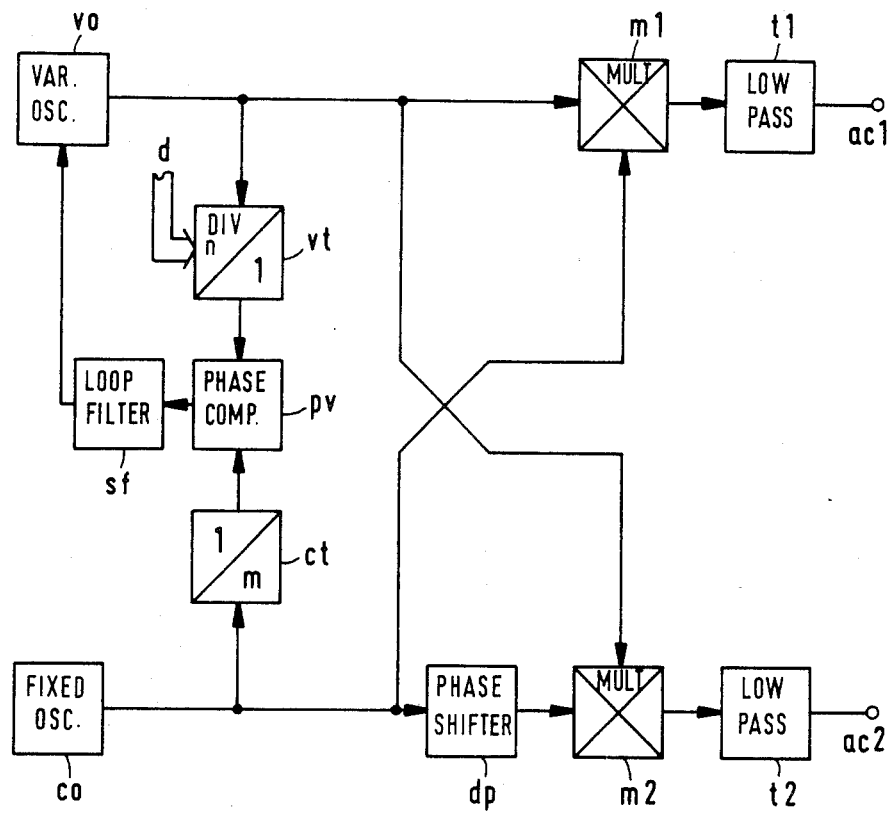
FIG. 3 is a block diagram of an embodiment with a frequency allocation scheme.

FIG. 3 shows a further embodiment of the invention. The fixed frequency oscillator co supplies with its output signal the 90° phase shifter dp, the first input of the first multiplier m1, and the fixed frequency divider ct whose divisional number is m. The output signal of variable oscillator vo is supplied to the respective second inputs of the two multipliers m1, m2 as well as the variable frequency divider vt whose divisional number n is capable of being set by the digital data d. The output signals of the frequency dividers ct, vt are each applied to one input of phase comparator pv whose output signal, via the loop filter sf, is fed to the control input of the variable oscillator vo. The first low-pass t1 is connected to the output of the first multiplier m1, with the output signal of the low-pass filter t1 being the first sinusoidal signal ac1. To the output of the second multiplier m2 there is connected the second low-pass filter t2 whose output signal is the other sinusoidal signal ac2.

A simple numerical example shows the function of the described circuit. The fixed frequency oscillator co oscillates at a frequency of 30 MHz. The number of divisions m of the fixed frequency divider ct is assumed at 3,000, so that the divided-down fixed frequency amounts to 10 kHz. With respect to the frequency of the variable oscillator vo there is assumed a frequency of 31 MHz; accordingly, from the difference frequency, there results a frequency of 1 MHz with respect to the 90° phase-shifted sinusoidal signals ac1, ac2 at the output of the generator circuit. The oscillator signal of 31 MHz is divided in its frequency by the variable frequency divider having a number of divisions n=3,100. This results in a divided-down frequency of 10 kHz for the variable oscillator signal. At the frequency level of 10 kHz there is now carried out the phase comparison in the phase comparator pv.

In cases where either the frequency or the phase of the two signals to be compared differ from one another, the phase comparator pv changes its output signal depending on the amount and the sign of the measured phase difference between its two input signals. The low-pass filter having a suitable frequency characteristic, therefore referred to as a loop filter sf, smoothes the output signal of the phase comparator pv and supplies the control input of the continuously variable oscillator vo. If, with the aid of a suitable data word d, the divisional number n of the variable frequency divider is increased by one step to n=3,101, the phase-locked loop locks the continuously variable oscillator vo at a frequency value which deviates by 10 kHz from the original value, namely at 31.010 MHz or 30.09 MHz, depending on the connection assignment at the phase comparator pv. Accordingly, these fixed 10-kHz steps in the course of a continuous variation represent the aforementioned frequency allocation scheme.

The 90° phase shifter dp, the low-pass filters t1, t2, t3 and the loop filter sf can be realized, for example, with the aid of reactance circuits or monolithically integrable resistance-capacitor combinations (=RC circuits), which consist of sheet resistors and metal-insulating-layer (MIS) capacitors and, in connection with amplifier and buffer circuits, produce the desired frequency characteristics. Such compact arrangements with short internal connecting leads without any external connections represent a low-induction, low-loss construction having small stray capacitance which, on the one hand, operates nearly in an ideal manner also up to one to two decades above the limit or cutoff frequency and, on the other hand, is single-beam resistant with respect to external noise signals, and also itself only radiates a minimum of noise signals. By way of example, an RC circuit having a limit frequency of 20 MHz may be provided by an easily integrable metallized insulated-gate capacitor of 4 pF and in an assignable sheet-resistor of 2 kΩ, which is likewise easily integrable.

The accuracy of the frequency characteristic can be achieved in reactance circuits by changing the set values or else. When RC circuits serve as the frequency-determining elements, the frequency characteristic accuracy is achieved by way of an individual balancing process of the sheet-resistors or of the metal-insulating-layer (MIS) capacitors, in that partial resistors or partial capacitors are either connected thereto or therefrom. This may be effected by a permanent splitting or disconnection or connection of the connecting leads between parallel-connecting partial elements, or else by a permanent bridging or series-connection of series-connected partial elements with the aid of conductor leads, e.g., with the aid of a laser or else by employing a local overheating technique. In accordance with a different method, the metal coating of the metal-insulating layer (MIS) capacitors is partially removed by a laser beam, so that in this way the capacity can be reduced. Finally, there may still be thought of a programmable balancing in cases where the partial capacitors and the partial resistors are capable of being connected thereto or disconnected therefrom with the aid of electronic switches, such as transistors, in which case the switch positions are variable at will.

The 90° phase shifter, however, may also be realized in the form of a digital 90° phase shifter. The phase shifter receives the fixed frequency signal which, as a rectangular or square-wave signal, is designed to have a pulse/no pulse ratio of perferably 1:1. In addition, the phase shifter is supplied with a further rectangular or square-wave signal which is phase-locked in relation thereto, of four times the frequency of the fixed-frequency signal and with a pulse/no pulse ratio of preferably 1:1. With the aid of a logic gate the two rectangular or square-wave signals are combined in such a way that the output signal of the 90° phase shifter is shifted in phase by 90° with respect to the fixed frequency signal.

On optimal integrated embodiment of the generator circuit according to the invention is not only based on possible equal electrical characteristics relating to the two signal paths of the sinusoidal signals ac1, ac2 or sum frequency signals s1, s2, but in addition has the two signal paths laid out as mirror images of each other to obtain a good synchronous operation.

What is claimed is:

1. A generator circuit for generating first and second jointly frequency-variable sinusoidal signals which are phase shifted by 90° in relation to one another, comprising:
    a first analog multiplier;
    a 90° phase shifter;
    a main oscillator;
    a fixed frequency divider coupled to said main oscillator, and a third low-pass filter whose cutoff (limit) frequency lies below the output signal frequency of said fixed frequency divider, said third low-pass filter coupled to the output of said fixed frequency divider and to the input of said 90° phase shifter and to a first input of said analog multiplier;
    a second analog multiplier having a first input connected to the output of said 90° phase shifter;
    a variable frequency divider coupled to said main oscillator, and whose number of divisions is determined by digital data and having its output coupled to a second input of said first multiplier and to a second input of said second multiplier;
    a first low-pass filter coupled to the output of said first multiplier, the output of said first low-pass filter providing said first sinusoidal signal;
    a second low-pass filter coupled to the output of said second multiplier, the output of said second low-pass filter providing said second sinusoidal signal; and wherein
    the upper cutoff frequencies of said first and second low-pass filters lie between the sum and the difference of the frequencies of the signals provided by said fixed frequency divider and of said variable frequency divider.

2. A generator circuit in accordance with claim 1, wherein:
    both said first and second low-pass filter have identical frequency characteristics.

3. A generator circuit for generating first and second jointly frequency-variable sinusoidal signals which are phase shifted by 90° in relation to one another, comprising:
    a first analog multiplier;
    a 90° phase shifter;
    a fixed frequency oscillator whose output is connected to the input of said 90° phase shifter and to a first input of said analog multiplier;
    a second analog multiplier having a first input connected to the output of said 90° phase shifter;
    a continuously frequency-variable oscillator having its output coupled to a second input of said first multiplier and to a second input of said second multiplier;
    a first low-pass filter coupled to the output of said first mulitplier, the output of said first low-pass filter providing said first sinusoidal signal;
    a second low-pass filter coupled to the output of said second multiplier, the output of said second low-pass filter providing said second sinusoidal signal; wherein
    the upper cutoff frequencies of said first and second low-pass filters lie between the sum and the difference of the frequencies of said fixed frequency oscillator and of said variable frequency oscillator;
    a first band-pass filter connected to the output of said first multiplier and a second band-pass filter connected to the output of said second multiplier;
    the center frequency of said first and second band-pass filters is the sum, the lower cutoff frequency of said first and second band-pass filters lies between the sum and the difference, and the upper cutoff frequency of said first and second band-pass filters lies between the sum and double the sum of the frequencies of said fixed-frequency oscillator and of said variable frequency oscillator;
    the output signal of said first band-pass filter represents a first sinusoidal sum-frequency signal; and
    the output signal of said second band-pass filter represents a second sinusoidal sum-frequency signal.

4. A generator circuit for generating first and second jointly frequency-variable sinusoidal signals which are phase shifted by 90° in relation to one another, comprising:

a first analog multiplier;

a 90° phase shifter;

a fixed-frequency oscillator whose output is connected to the input of said 90° phase shifter and to a first input of said analog multiplier;

a second analog multiplier having a first input connected to the output of said 90° phase shifter;

a continuously frequency-variable oscillator having its output coupled to a second input of said first multiplier and to a second input of said second multiplier;

a first low-pass filter coupled to the output of said first multiplier, the output of said first low-pass filter providing said first sinusoidal signal;

a second low-pass filter coupled to the output of said second multiplier, the output of said second low-pass filter providing said second sinusoidal signal; wherein the upper cutoff frequencies of said first and second low-pass filters lie between the sum and the difference of the frequencies of said fixed frequency oscillator and of said variable frequency oscillator;

the output signal of said fixed-frequency oscillator is applied to the input of a fixed frequency divider;

the output signal of said continuously variable oscillator is applied to the input of a variable frequency divider whose number of divisions is determined by digital data;

the output signal of said fixed-frequency divider supplies the first input of a phase comparator whose output signal, is applied to a control intput of said variable oscillator via a loop filter; and the output signal of said variable frequency divider supplies a second input of said phase comparator.

5. A generator circuit in accordance with claim 4, wherein:

said 90° phase shifter is a digital type of 90° phase shifter;

said fixed-frequency oscillator provides a rectangular output (square-wave) signal having a pulse/no pulse ratio of preferably 1:1; and said digital 90° phase shifter contains means for combining said rectangular output (square-wave) signal and a further rectangular (square-wave) signal which is phase locked in relation thereto and having four times the frequency of said rectangular output (square-wave) signal and a pulse/no pulse ratio of preferably 1:1.

* * * * *